United States Patent [19]

Kerber

[11] Patent Number: 4,806,846

[45] Date of Patent: Feb. 21, 1989

[54] HIGH ACCURACY DIRECT READING CAPACITANCE-TO-VOLTAGE CONVERTER

[76] Inventor: George L. Kerber, 4611 Lisann St., San Diego, Calif. 92117

[21] Appl. No.: 70,342

[22] Filed: Jul. 6, 1987

[51] Int. Cl.$^4$ .................. G01R 11/52; G01R 27/26
[52] U.S. Cl. ........................... 324/60 CD; 324/60 C
[58] Field of Search .............. 324/60 CD, 60 C, 60 R

[56] References Cited

U.S. PATENT DOCUMENTS

| | | | |
|---|---|---|---|
| 4,149,231 | 4/1979 | Bukosky et al. | 324/60 CD |
| 4,251,767 | 2/1981 | Montana | 324/60 C |
| 4,459,541 | 7/1984 | Fielden et al. | 324/60 CD |

Primary Examiner—Reinhard J. Eisenzopf
Assistant Examiner—Anthony L. Miele
Attorney, Agent, or Firm—Morland C. Fischer

[57] ABSTRACT

A relatively simple circuit for implementing a low-cost, low power, highly accurate capacitance-to-voltage converter by which to measure the unknown capacitance of a capacitor. The circuit is characterized by the ability to eliminate error due to stray capacitance sources. The circuit is implemented by a crystal controlled clock generator which produces multi-phase clock signals to control the operation of a pair of series connected field effect transistors and a buffer amplifier. The field effect transistors are alternately switched on and off to periodically charge and discharge the capacitor under measurement between a source of reference potential and the inverting input terminal of a precision operational amplifier. The output voltage of the operational amplifier tracks the capacitance of the capacitor under measurement, such that an accurate indication of its capacitance is obtained by merely reading the output of the operational amplifier.

18 Claims, 1 Drawing Sheet

HIGH ACCURACY DIRECT READING CAPACITANCE-TO-VOLTAGE CONVERTER

BACKGROUND OF THE INVENTION

1. FIELD OF THE INVENTION

This invention relates to a relatively simple and low-cost circuit configuration that implements a capacitance-to-voltage converter which is highly immune to stray capacitance and which accurately measures the unknown capacitance of a capacitor.

2. PRIOR ART

Existing capacitive-type sensors are known which are characterized by considerable stray capacitance-to-ground as a consequence of bonding wires, connectors, headers, ground shields, etc. For example, capacitive-type pressure transducers sense pressure by undergoing a change in dimension, whereby capacitance is a function of applied pressure. The change in capacitance for a full scale pressure change may be only a few picofarads. This small change is difficult to measure in the presence of high stray capacitance-to-ground which may vary with temperature, shock and vibration. More particularly, sophisticated capacitor bridges, RC and LC oscillator-type circuits, and RC charge and discharge time-based circuits are either sensitive to stray capacitance or require highly accurate standard capacitors, such that the cost of the measurement equipment or circuitry may far exceed the cost of the sensor.

Occasionally, it is desirable to measure small capacitors, such as integrated circuit MOS capacitors. Due to the small size of these capacitors, it is difficult to accurately measure the capacitance values thereof while using conventional measurement techniques. Morever, the stray capacitance of the test fixtures also interferes with obtaining a precise measurement of capacitance. On-chip integrated capacitance-to-voltage conversion circuits are available which attempt to reduce the effect of stray capacitance and provide a more accurate measurement of such small capacitors. These conversion circuits use switched capacitor techniques that generate a voltage or digital work which is proportional to capacitance or the difference between a reference capacitor and an unknown capacitor. However, the accuracy of these conversion circuits is degraded by clock feedthrough and nonlinearities. Moreover, such circuits are also characterized by limited resolution.

Precise measurement of capacitance is usually accomplished by comparing an unknown value of capacitance with a known value using a bridge circuit. Extremely accurate and high resolution (to 1 ppm) shielded capacitor bridges have been constructed and are used in metrology laboratories. However, a high degree of skill is required to operate these instruments in order to achieve accurate results on small capacitors, since the measurement is greatly influenced by the stray capacitance of conventional test fixtures.

Other capacitance measurement instruments depend upon accurately measuring the charge and discharge times of RC circuits. Such instruments are popular because of their simplicity and compatibility with the single chip digital voltmeter integrated circuit. Unfortunately, such instruments have limited resolution and are very sensitive to stray capacitances of test fixtures or test leads.

Still other techniques indicate capacitance by measuring the impedance of the capacitor using a 4-terminal pair configuration which reduces the effects of stray capacitance. Instruments based upon this technique calculate capacitance from a measurement of reactance. Therefore, such instruments, while being very accurate, are also very complex and expensive.

SUMMARY OF THE INVENTION

Briefly, a circuit is disclosed for implementing a highly accurate, direct reading, capacitance-to-voltage converter which is immune to the effects of stray capacitance-to-ground and by which a measurement is provided of the unknown capacitance of a capacitor. The circuit includes a crystal controlled clock generator which is adapted to supply multi-phase clock signals for controlling the operation of a buffer amplifier and a pair of field effect transistor devices, the conduction paths of which are connected in electrical series between a ground and the current summing junction or virtual ground of a precision operational amplifier. The capacitor under measurement is connected between the output of the buffer amplifier and the series node of the field effect transistor pair.

Operation of the converter circuit is based upon the principle of generating a precise current which is proportional to the unknown capacitance of the capacitor under measurement. The foregoing is accomplished by means of the series connected field effect transistors alternately connecting the capacitor so as to either be charged to a source of reference potential through the buffer amplifier or discharged into the summing junction (or virtual ground) of the precision operational amplifier. More particularly, a pair of non-overlapping clock signals from the clock generator causes the pair of field effect transistors to be alternately rendered conductive, but not conductive at the same time. Accordingly, the field effect transistors successively reverse the leads of the capacitor under measurement between the charge and discharge cycles thereof which tends to reduce errors due to stray capacitance-to-ground. The current which is developed by the periodic discharge of the capacitor under measurement into the summing junction of the operational amplifier generates a voltage at the output of the operational amplifier which is exactly proportional to the capacitance of the capacitor. Thus, by merely reading the voltage at the output terminal of the operational amplifier, an accurate measurement of the capacitance of the capacitor is provided.

DESCRIPTION OF THE PREFERRED EMBODIMENT

Figure 1:
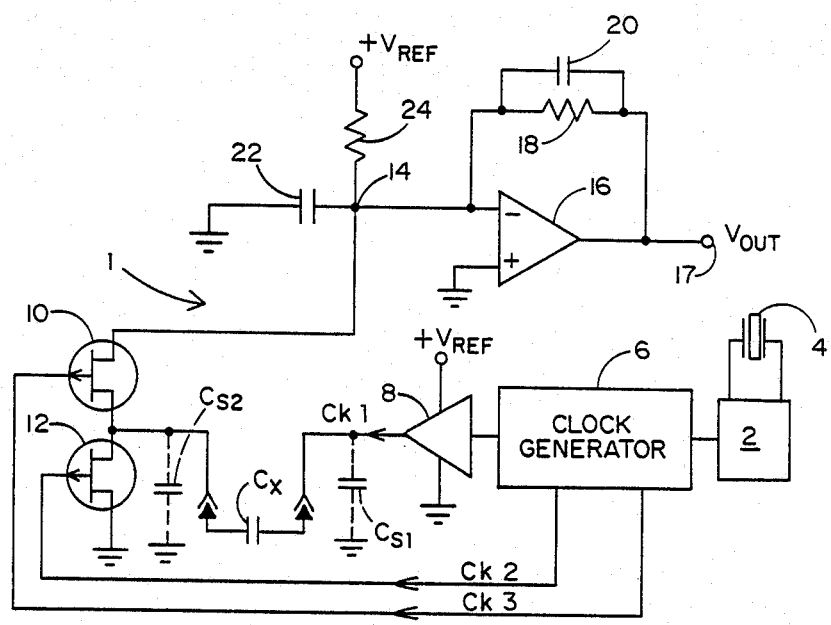
FIG. 1 shows a schematic circuit for implementing the highly accurate, direct reading capacitance-to-voltage converter which forms the present invention.
Figure 2:
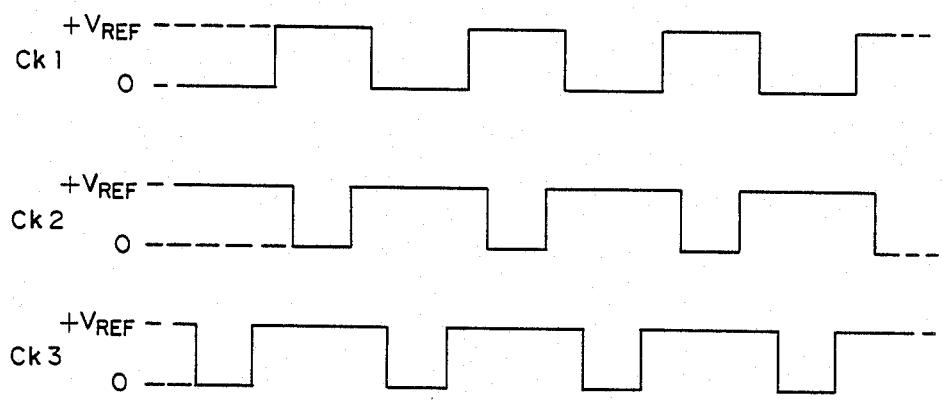
FIG. 2 is illustrative of the multi-phase clock signals which control the operation of the circuit of FIG. 1.

The capacitance-to-voltage converter circuit which forms the present invention is now described while referring to the drawings where, in FIG. 1, there is shown a schematic of the preferred circuit 1. The timing signals for controlling the operation of the circuit 1 are shown in FIG. 2. The circuit 1 is implemented by the formation of a crystal controlled oscillator having an amplifier 2 which is connected in a feedback loop to a crystal 4. The output of the crystal oscillator drives a non-overlapping clock generator 6. One output terminal of clock generator 6 is connected to an input terminal of a CMOS buffer amplifier 8. Another input terminal of buffer amplifier 8 is connected to a source of positive reference potential, designated $V_{REF}$. The output terminal of buffer amplifier 8 is connected to one plate of the capacitor under measurement, designated Cx. The second plate of capacitor Cx is connected to the intersection (i.e. series node) of the respective conduction paths of a pair of series connected transistor switching devices 10 and 12. According to a preferred embodiment, transistor switching devices 10 and 12 are p-channel junction field effect transistors (JFETs). The control electrodes of JFETs 10 and 12 are connected to output terminals of clock generator 6, so that the operation of JFETs 10 and 12 is controlled by the clock signals which are supplied thereto from generator 6. The series connected conduction paths of JFETs 10 and 12 are connected between a common electrical junction 14 and ground.

Common electrical junction 14 is connected to the inverting input terminal of a precision operational amplifier 16. The noninverting input terminal of operational amplifier 16 is connected to circuit ground. The output voltage, designated $V_{out}$, at the output terminal 17 of operational amplifier 16 is fed back to the inverting input terminal of amplifier 16 via a feedback resistor 18. A virtual ground (i.e. a point of zero potential) is formed at electrical junction 14, since the high open loop gain of the operational amplifier 16 forces junction 14 to be at the same potential as the noninverting input terminal which is connected to circuit ground. A filter capacitor 20 is connected in electrical parallel across feedback resistor 18. A charge "catching" capacitor 22 is connected between common electrical junction 14 and circuit ground. A resistor 24 is connected between common electrical junction 14 and the aforementioned source of positive reference potential $V_{REF}$ to provide the zero or offset compensation of $V_{OUT}$.

The operation of the capacitance-to-voltage converter 1 is now described while referring concurrently to FIGS. 1 and 2. As is best shown in FIG. 2, the crystal controlled clock generator 6 and buffer amplifier 8 of circuit 1 produce three phase clock signals, designated Ck1, CK2 and Ck3. The clock signals alternate between relatively low (e.g., ground) and relatively high (e.g., $+V_{REF}$) logic levels. JFETs 10 and 12 are alternately rendered conducting when their respective clock signals are low and non-conducting when their respective clock signals are high. Clock signals Ck2 and Ck3 are non-overlapping and, therefore, the JFETs 10 and 12 will not be simultaneously rendered conducting.

Clock signal Ck1 is relatively high during the first half cycle thereof. Also during the first half cycle of Ck1, clock signal Ck2 goes relatively low to connect the control electrode of JFET 12 to ground, whereby JFET 12 is rendered conducting. Accordingly, capacitor Cx is charged to $V_{REF}$ through buffer amplifier 8. Before clock signal Ck1 goes relatively low during the next half cycle thereof, clock signal Ck2 switches to a relatively high logic level to connect the control electrode of JFET 12 to the reference potential $V_{REF}$, whereby JFET 12 is rendered non-conducting and capacitor Cx is prevented from being discharged.

Clock signal Ck1 goes to a relatively low logic level during the second half cycle thereof. Also during the second half cycle of CK1, clock signal Ck3 goes to a relatively low logic level to connect the control electrode of JFET 10 to ground, whereby JFET 10 is rendered conducting. Accordingly, the capacitor Cx is discharged into common electrical junction 14 (i.e., the virtual ground or summing node of operational amplifier 16) via the conduction path of JFET 10. Also during the second half cycle of Ck1, clock signal Ck3 goes to a relatively high logic level, whereby JFET 10 is rendered non-conducting.

Thus, the cycle of charging and discharging capacitor Cx repeats at the frequency of clock signal Ck1, which is designated Fclock. The current flowing from summing electrical junction 14 due to the periodic charging and discharging of capacitor Cx is equal to Fclock*Cx*$V_{REF}$, inasmuch as a charge equal to Cx*$V_{REF}$ is dumped alternatively into the summing electrical junction 14 at the time rate of change or frequency of clock signal Ck1 (i.e., Fclock).

As will be known to those skilled in the art, the sum of all of the currents flowing into and out of electrical junction 14 must add to zero. In order to balance the current from the periodic discharge of capacitor Cx into electrical junction 14 (which is at virtual ground or zero potential), the sum of the currents represented by $V_{REF}$/R24 and $V_{OUT}$/R18 must equal the current represented by Fclock*Cx*$V_{REF}$. The following equation is obtained by equating the aforementioned currents and solving for $V_{OUT}$ (i.e., the output voltage from operational amplifier 16):

$$V_{OUT} = V_{REF}*R18 ((Fclock*Cx) - (1/R24)),$$

where R18 is the resistance of feedback resistor 18 and R24 is the resistance of the zero or offset compensation resistor 24.

It may be recognized that the output voltage $V_{OUT}$ of operational amplifier 16 is exactly proportional to the capacitance of capacitor Cx. The output voltage $V_{OUT}$ of amplifier 16 may be conveniently scaled by adjusting the feedback resistor 18. What is more, the output voltage $V_{OUT}$ of amplifier 16 may be easiy zeroed or offset by adjusting the value of resistor 24. If resistor 24 were to be eliminated from the circuit 1, the total output voltage $V_{OUT}$ is zero for zero capacitance to within the offset voltage and bias current limitations of operational amplifier 16.

In order for the output voltage $V_{OUT}$ of amplifier 16 to be a ripple-free DC voltage. filter capacitor 20 is added across feedback resistor 18 to form a low pass RC filter having a cutoff frequency which is selected to be much less than Fclock (i.e., the frequency of clock signal Ck1). The charge "catching" capacitor 22 reduces the amplitude of any switching transients which might cause the operational amplifier 16 to saturate. Capacitor 22 avoids the need for a precision, high cost, high slew rate, wide bandwidth amplifier. Since one plate of capacitor 22 is connected to a virtual ground (i.e. summing junction 14), capacitor 22 and has no other effect on circuit 1 than that of an efficient, low-cost means for reducing the amplitude of switching transients.

Clock feedthrough from the gate-drain capacitance of JFET 10 does not contribute a net voltage at the output of amplifier 16, since currents of equal magnitude but opposite sign alternately flow into the summing junction 14 during each full clock cycle and are averaged to zero by capacitor 20 and feedback resistor 18. Thus, the converter circuit 1 herein disclosed also advantageously minimizes the effect of clock feedthrough on the accuracy of measuring the capacitance of capacitor Cx. More particularly, stray capacitanceto-ground (represented by the capacitors shown in phantom in FIG. 1 and designated $C_{S1}$ and $C_{S2}$) is coupled to opposite plates of capacitor Cx. Capacitor $C_{S1}$ is charged to $V_{REF}$ and discharged to ground through buffer amplifier 8 during each period of the clock signal CK1. The charge on capacitor $C_{S1}$ does not contribute to the charge on capacitor Cx or to the currents at the summing junction 14 of operational amplifier 16 and, therefore, there is no contribution to output voltage $V_{OUT}$ from capacitor $C_{S1}$. Capacitor $C_{S2}$ also does not contributute to the charge on capacitor Cx or to the current at summing junction 14, since capacitor $C_{S2}$ is shunted by the on-resistance of JFET 12 when capacitor Cx is being charged to $V_{REF}$. Therefore, capacitor $C_{S2}$ accumulates no net charge during the charging cycle of capacitor Cx.

By virute of the present invention, a relatively simple, low power, low cost capacitance-to-voltage converter is provided which minimizes the effects of stray capacitance-to-ground and clock feedthrough on the accuracy of measuring an unknown capacitance of a capacitor under measurement. Moreover, the converter also allows a highly accurate determination of such capacitance when the capacitor under measurement is remotely connected to the circuit by shielded cables. The present capacitance-to-voltage converter completely eliminates the problems associated with conventional switched capacitor converters, because clock feedthrough and stray capacitance-to-ground have virtually no effect on the accuracy of the capacitance measurement. What is more, by using miniature shielded probes, the present capacitance-to-voltage converter is also suitable for accurately measuring small value capacitors (e.g. integrated MOS capacitors and hybrid circuit chip capacitors), because of its inherent ability to virtually eliminate error from stray capacitance-to-ground sources. More specifically, test results performed on the disclosed converter show that the voltage $V_{OUT}$ at the output terminal 17 of operational amplifier 16 tracks the capacitance of capacitor Cx to within the ±0.01 picofarard or ±0.05% full scale for a 20 picofarad full scale output.

It will be apparent that while a preferred embodiment of the invention has been shown and described, various modifications and changes may be made without departing from the true spirit and scope of the invention. For example, equivalent devices could be substituted for the switching devices illustrated in FIG. 1 for implementing circuit 1. More particularly, n-channel field effect transistors could be substituted for JFETs 10 and 12, if the polarity of $V_{REF}$ and all clock signals were to be reversed. Moreover, MOSFETs could also be used in place of JFETs 10 and 12. In addition, changes to the timing of clock signals Ck1, CK2 and Ck3 may be made, for example, to simplify the design of the clock generator 6 or, for example, to accommodate large capacitance ratios of Cx to $C_{S2}$. When the ratio of Cx to $C_{S2}$ is large, the potential across $C_{S2}$ momentarily approaches $V_{REF}$ at a time when Ck1 goes relatively high and before Ck2 goes relatively low. This potential may cause JFET 10 to beocme conductive which will introduce a nonlinearity into $V_{OUT}$. To prevent this momentary potential buildup on $C_{S2}$, the clock generator 6 can be modified to have the rising edge of CK1 coincide with the falling edge of Ck2 which causes JFET 12 to become conductive as CK1 goes relatively high, whereby to shunt any charge buildup on $C_{S2}$ to ground.

Extensions of the present invention could include using $V_{REF}$ as the reference voltage for a digital voltmeter instrument or integrated circuit to ratiometrically measure the output voltage $V_{OUT}$ to thereby remove variations in $V_{REF}$ from $V_{OUT}$.

Having thus set forth a preferred embodiment of the present invention, what is claimed is:

1. A circuit for providing an accurate measurement of the capacitance of a capacitor, said circuit comprising:
   clock signal generator means for providing a signal which alternates between relatively high and low signal levels, said signal generator means interconnected with a first plate of said capacitor to supply said clock signal thereto;
   operatonal amplifier means having first input terminal means connected to a summing node, second input terminal measn connected to ground, and output terminal means providing an output voltage signal, said capacitor being discharged into said summing node at the first input terminal means of said operational amplifier means; and
   means for successively charging and discharging said capacitor as said clock signal alternates between relatively high and low signal levels, said charging and discharging means including switch means connected between the second plate of said capacitor and said summing node;
   the magnitude of the voltage signal at the output terminal means of said operational amplifier means providing a measurement of the capacitance of said capacitor.

2. The circuit recited in claim 1, wherein said means for charging and discharging said capacitor also includes a buffer amplifier connected between said clock signal generator means to receive said clock signal therefrom and the first plate of said capacitor for charging said capacitor each time that said clock signal is at the relatively high signal level, the closure of said switch means discharging said capacitor into said summing node each time that said clock signal is at the relatively low signal level.

3. The circuit recited in claim 1, further comprising a charge catching capacitor connected to the first input terminal means of said operational amplifier means to reduce the amplitude of switch transients from said switch means and thereby prevent the saturation of said operational amplifier means.

4. The circuit recited in claim 1, wherein said switch means includes at least one multi-terminal semiconductor device having a conduction path connected between the second plate of said capacitor and said summing node at the first input terminal means of said operational amplifier means.

5. The circuit recited in claim 4, wherein said multi-terminal semiconductor device is a field effect transistor having a pair of conduction path terminals and a control terminal.

6. The circuit recited in claim 5, wherein said switch means comprises a pair of said field effect transistors having their respective conduction paths connected in electrical series between the first input terminal means of said operational amplifier means and ground.

7. The circuit recited in claim 6, wherein said clock signal generator means is connected to the respective control terminals of said pair of field effect transistors to control the operations thereof.

8. The circuit recited in claim 7, wherein said clock signal generator means supplies multi-phase clock signals.

9. The circuit recited in claim 6, wherein said clock signal generator means applies non-overlapping multi-phase clock signals to the respective control terminsla of said pair of field effect transistors, such that one of said transistors is rendered conducting while the other transistor is rendered non-conducting, and vice versa, for successively charging and discharging said capacitor.

10. The circuit recited in claim 1, wherein said clock signal generator means includes a crystal controlled oscillator.

11. THe circuit recited in claim 1, further comprising an RC low pass filter connected between the output terminal means and the first input terminal means of said operational amplifier means.

12. The circuit recited in claim 1, further comprising a resistor connected between a source of reference potential and the first input terminal means of said operational amplifier means to provide for offset compensation of the output terminal means of said operational amplifier means.

13. A capacitance-to-voltage converter circuit for providing an accurate measurement of the capacitance of a capacitor, said circuit comprising:

clock means for supplying a clock signal which alternates between relatively high and relatively low voltage levels;

operational amplifier means having input and output terminal means; and means for successively charging and discharging said capacitor including a buffer amplifier interconnected between said clock means and one plate of said capacitor for charging said capacitor during a first portion of the clock signal, and multi-terminal semiconductor switch means interconnected between said operational amplifier means and the second plate of said capacitor for discharging said capacitor to the input terminal means of said operational amplifier means during a second portion of the clock signal;

the magnitude of the voltage at the output terminal means of said operational amplifier means providing a measurement of the capacitance of said capacitor.

14. The circuit recited in claim 13, wherein said clock means includes a crystal controlled oscillator.

15. The circuit recited in claim 14, wherein said clock means also includes a non-overlapping clock generator which is driven by the output of said crystal controlled oscillator.

16. The circuit recited in claim 13, wherein the input terminal means of said operational amplifier means comprises an inverting input terminal connected to said semiconductor switch means at a virtual ground and a non-inverting input terminal connected to ground.

17. The circuit recited in claim 16, wherein said semiconductor switch means comprises a pair of field effect transistors having their respective conduction paths connected in electrical series between the inverting input terminal of said operational amplifier means and ground, said clock means being connected to the respective control terminals of said pair of field effect transistors to control the operation thereof, and the second plate of said capacitor being connected to the series node between said pair of field effect transistors.

18. The circuit recited in claim 17, wherein said clock means also applies non-overlapping clock signals to the respective control terminals of said pair of field effect transistors, such that one of said transistors is rendered conducting while the other transistor is rendered non-conducting, and vice versa, for successively charging and discharging said capacitor.

* * * * *